United States Patent
Ashby

(10) Patent No.: US 8,804,333 B2
(45) Date of Patent: Aug. 12, 2014

(54) DATA FRAME HOT/COLD AISLE BAFFLE SYSTEM

(71) Applicant: Cellco Partnership, Basking Ridge, NJ (US)

(72) Inventor: Frederick J. Ashby, Chuluota, FL (US)

(73) Assignee: Cellco Partnership, Basking Ridge, NJ (US)

( * ) Notice: Subject to any disclaimer, the term of this patent is extended or adjusted under 35 U.S.C. 154(b) by 0 days.

(21) Appl. No.: 14/087,746

(22) Filed: Nov. 22, 2013

(65) Prior Publication Data

US 2014/0078667 A1    Mar. 20, 2014

Related U.S. Application Data

(63) Continuation of application No. 13/106,633, filed on May 12, 2011, now Pat. No. 8,605,435.

(51) Int. Cl.
*H05K 7/20* (2006.01)
*H05K 7/14* (2006.01)
*G06F 1/20* (2006.01)

(52) U.S. Cl.
CPC .......... *H05K 7/20754* (2013.01); *H05K 7/1497* (2013.01); *H05K 7/20709* (2013.01); *H05K 7/20736* (2013.01); *G06F 1/20* (2013.01)
USPC ............................. 361/695; 361/690; 454/184

(58) Field of Classification Search
CPC . H05K 7/20; H05K 7/20754; H05K 7/14997; H05K 7/20709; H05K 7/20736; H05K 7/1497; G06F 1/20
See application file for complete search history.

(56) References Cited

U.S. PATENT DOCUMENTS

| | | | |
|---|---|---|---|
| 7,986,526 B1 | 7/2011 | Howard et al. | |
| 8,037,644 B2 * | 10/2011 | Hall | 52/69 |
| 8,628,154 B2 * | 1/2014 | Caveney et al. | 312/198 |
| 8,628,158 B2 * | 1/2014 | Caveney | 312/265.3 |
| 2004/0218355 A1 | 11/2004 | Bash et al. | |
| 2009/0129000 A1 | 5/2009 | Hoeft et al. | |
| 2009/0277605 A1 | 11/2009 | VanGilder et al. | |
| 2010/0061057 A1 * | 3/2010 | Dersch et al. | 361/690 |
| 2010/0248609 A1 | 9/2010 | Tresh et al. | |
| 2011/0279967 A1 | 11/2011 | Classen | |
| 2012/0009862 A1 | 1/2012 | Meyer | |
| 2012/0037353 A1 | 2/2012 | Coors | |

OTHER PUBLICATIONS

Entire prosecution history of U.S. Appl. No. 13/106,633, filed May 12, 2011, entitled "Data Frame Hot/Cold Isle Baffle System."

* cited by examiner

*Primary Examiner* — Gregory Thompson

(57) ABSTRACT

A data room air circulation system has adjacent racks located side by side. The racks have a front, a rear, and a first and second side. A computer system component is mounted in at least one of the racks. A cold aisle, containing cold air, is located at the front of the racks. As the cold air passes through the component, hot air is formed and discharged to a hot aisle located at the rear of the racks. A baffle, having a front end, a rear end, and a hot air side is located between the racks. The front baffle end is attached to the front of one of the racks, and the rear end is attached to the rear of the other of the racks. The baffle separates the cold aisle from the hot aisle for at least the height of the baffle.

20 Claims, 6 Drawing Sheets

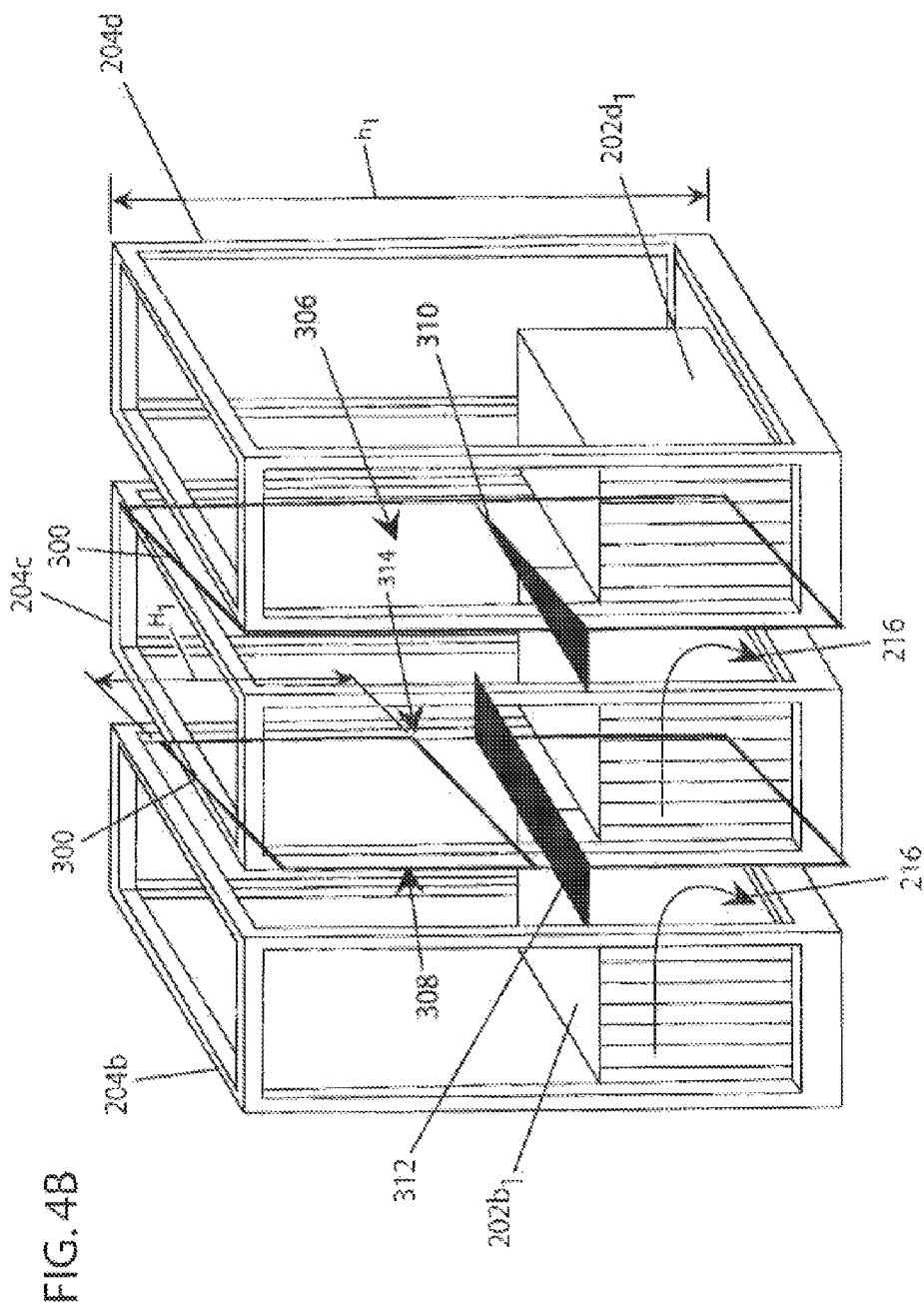

DATA FRAME HOT/COLD AISLE BAFFLE SYSTEM

RELATED APPLICATIONS

This application is a Continuation and claims the benefit of U.S. application Ser. No. 13/106,633 Filed May 12, 2011, the disclosure of which also is entirely incorporated herein by reference.

BACKGROUND

A data center room consists of an enclosed area where many computer system components such as servers, databases, and power supplies are located. Design of a data center room often requires both access to and from the computer system components, and incorporation of one or more ways to control the temperature within the data center room. Elevated air temperatures within the data center room may adversely affect a computer system's reliability, and may result in shut downs. FIG. 1 illustrates a typical data center room 100.

Computer system components 102 are often physically mounted in racks 104 in the data center room 100. Multiple rows of racks 104 may be arranged in the data center room 100, so long as the layout allows for access, typically through an aisle, to both a front 106 and a rear 108 of each rack 104. An aisle in front of the rack is typically referred to as a "cold aisle" 110, because in addition to providing access to the computer system components 102, the cold aisle 110 is the area where cooling air 112 is dispersed in order to cool the computer system components 102. An aisle located at the rear 108 of the rack 104 is typically referred to as a "hot aisle" 114. This provides access to the back of the computer system components 102. Further, the hot air 116 exhausted from the computer system components 102, which are now cooled, exits the back 108 of the rack 104 into the hot aisle 114 and rises.

The hot air 116 from the data center room 100 is drawn and directed into a computer room air conditioning unit ("CRAC") 118. The example of FIG. 1 illustrates two CRAC units 118. The CRAC 118 cools the air and then directs the cooled air 112 into a cooling air passageway 120, generally comprising an area under the floor 122 of the data center room 100 and above a subfloor 124. The cooling air 112 is dispersed from the cooling air passageway 120 to the racks 104 by passing through vents 126 in the floor 122. These vents 126 are located throughout the data center room 100, including the cold aisles 110. Once the cooling air is dispersed, it is free to circulate in the area of the racks 104.

One problem with current data center designs is that the cooling air 112 is drawn in the front 106 of the rack 104 and needs to exit the rear 108 of the rack 104. However, some computer system components 102 have an exhaust 203 on the side of the equipment, not in the rear. This then exhausts the hot air into the adjacent computer system components 102 and not into the hot aisle 114. In this instance, the cooling air 112 may never reach the computer system components 102 it was intended to cool. Thus, the computer system components 102 may draw heated air 116 into their own cooling systems, thereby increasing the danger of overheating, leading to reduced reliability, or a shutdown of the computer system components 102. That is, heated air 116 exhausted by or radiated from one computer system 102 in the rack 104 is re-circulated back into the same or other computer system components 102 in the rack.

Hence, a need exists for a device or method that allows a side exhaust of hot air from a computer system component without overheating adjacent computer system components.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 4B shows another simplified perspective rear view of the racks and baffles.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein relate to circulating and deflecting air within a data center room.

Figure 1:
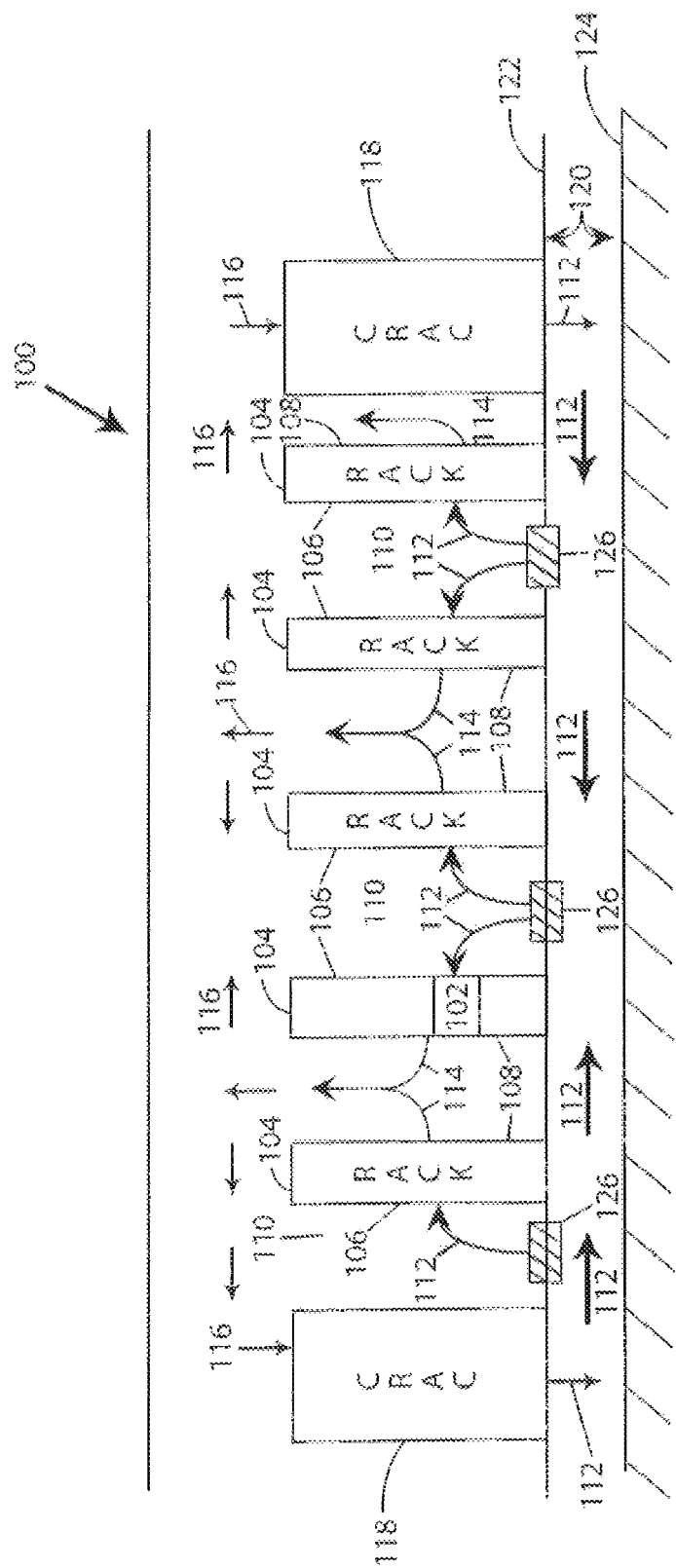
FIG. 1 illustrates a side view of a typical, prior art, data center room depicting the circulation path taken by air within the data center room.
Figure 2:
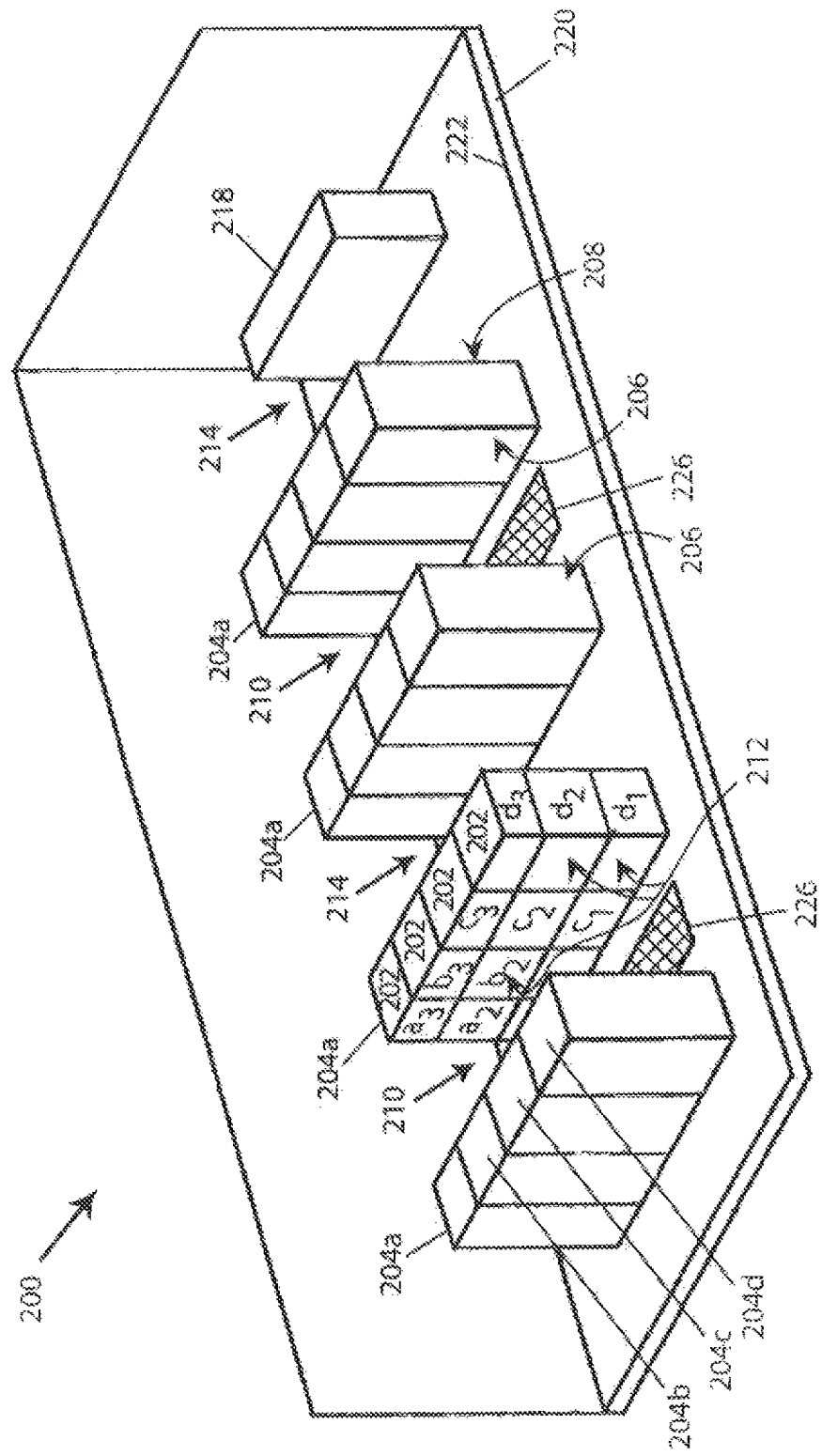
FIG. 2 shows a simplified perspective view of a data center room to which an example of the baffle(s) have been added.

Reference now is made in detail to the examples illustrated in the accompanying drawings and discussed below. FIG. 2 illustrates a simplified perspective view of a data center room 200, wherein like structures as discussed above are identical to those set forth below, so explanations thereof are omitted.

Figure 3:
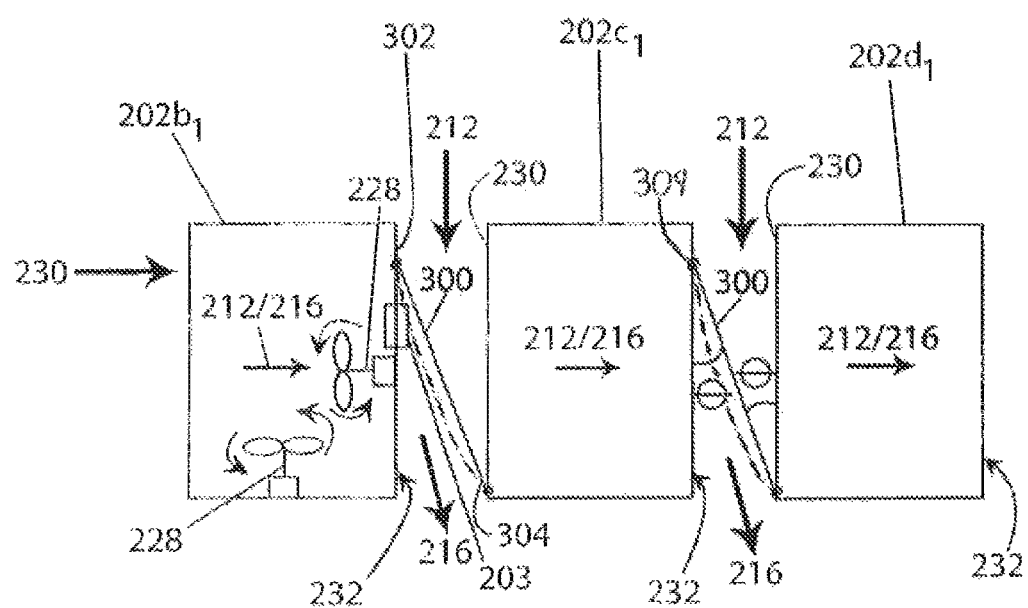
FIG. 3 illustrates an overhead view of the racks and baffles.

FIG. 2 illustrates multiple racks 204a-204d (referred to either collectively as racks 204 or individually as rack 204), wherein the racks 204a-204d are situated side-by-side along cold aisles 210 and hot aisles 214. Multiple computer system components $202a_1$-$202a_3$, $202b_1$-$202b_3$, $202c_1$-$202c_3$, and $202d_1$-$202d_3$, are mounted on shelves (not illustrated) of the racks 204a-204d or directly to the racks 204a-204d themselves. Cooled air 212 typically enters a front 206 of the rack 204 and can be drawn in by one or more fans 228 (illustrated in FIG. 3) mounted in the computer system component 202a-202d. The cooled air being generated by at least one CRAC 218, drawn through an air passage 220 under a floor 222 and discharged out vents 226. However, FIG. 3 illustrates that cooled air 212 can also be drawn in from a first side 230 of the computer system components 202a-202d and hot air 216 can exit a second side 232. As can be seen in FIG. 2, hot air 216 exiting a second side 232 can enter the computer system component in the adjacent rack 204.

FIG. 3 illustrates a baffle 300 which can be impervious or nearly impervious to air and is set between two adjacent racks 204b, 204c. The baffle 300 can be impervious based on its construction and prevent any cooled air 212 from passing through it to the hot aisle 214. The baffle 300 can be nearly impervious by, in one example, not being solid for a part of, or its entire, construction. Porous fabrics and meshes can be part of the baffle's 300 construction. However, it is desirable that the material provide some hindrance to air passing through it.

Figure 4A:
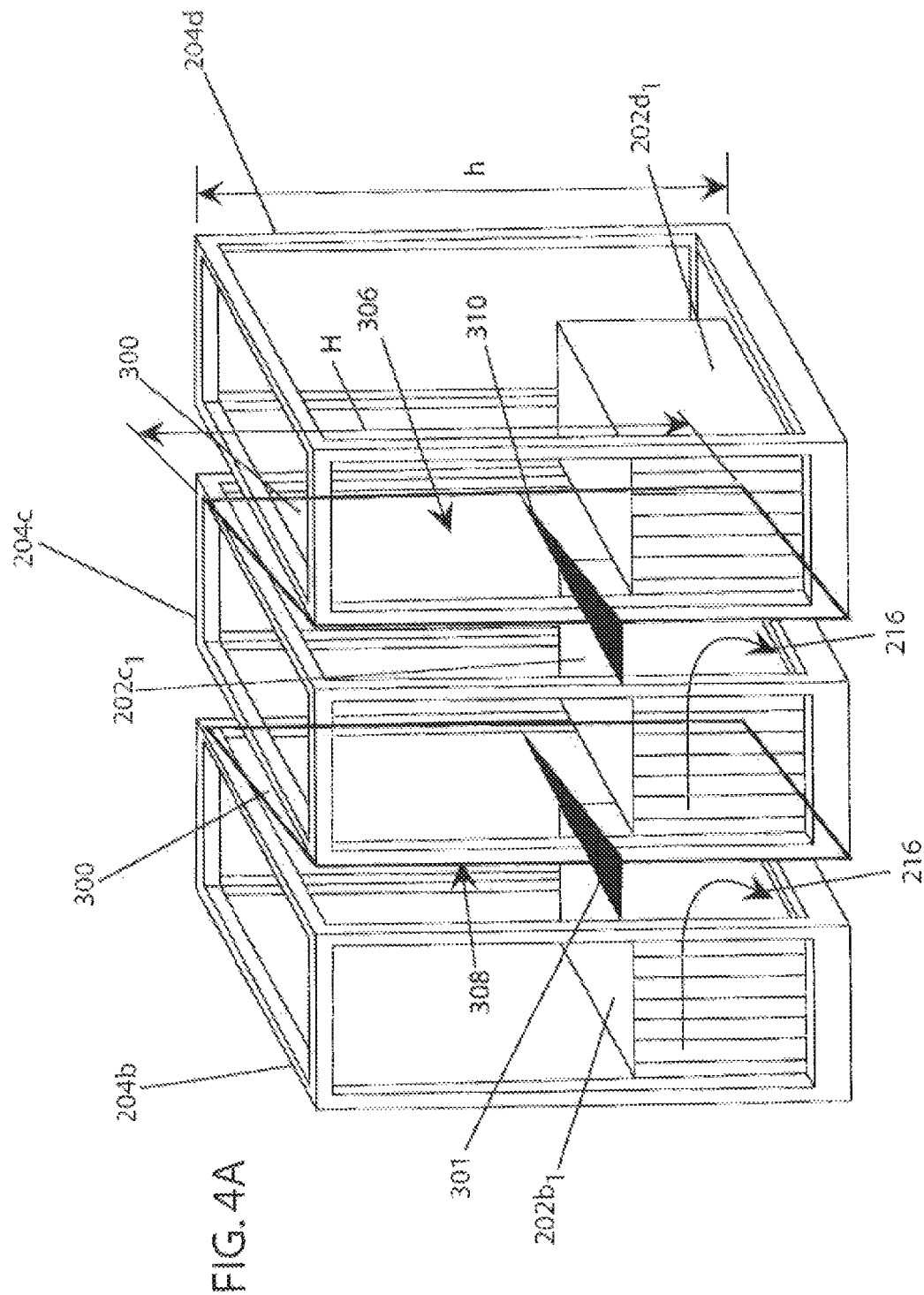
FIG. 4A shows a simplified perspective rear view of the racks and baffles.

In another example, the baffle 300 has a height H at least equal to a height h of the rack 204 (FIG. 4A). This height H is along an axis that extends generally from the floor 222 to the ceiling (not illustrated), i.e. in the vertical direction. In other examples, the baffle 300 can have a height H that is the height of the distances between shelves mounted in the rack 204, or the height of the individual computer system components 202a-202d if the components are mounted to the rack 204 directly. The baffle 300 can prevent the cooling air 212 from mixing and/or mingling with the hot air 216 along its height H.

FIG. 4B illustrates another example where the baffle height H1 is less than the rack 204 height h1. In the example, the height H1 is half the height h1 of the rack (i.e. H1=½h1). A typical rack 204 has a height denoted in "rack units." A rack unit or "U" is an Electronic Industries Alliance ("EIA") standard measuring unit for rack mount type equipment. While the internal height of the rack 204 remains constant, the outer height h of the rack 204 can vary. The most typical racks are 42 U and have a height h between approximately 6.5 feet to approximately 7 feet.

Further, the baffle 300 can be of single construction, or modular as to interlock to build up height between shelves/components. The baffle 300 is installed between the racks 204a-204d such that a front corner 302 is installed on one rack 204 and a rear corner 304 is installed on the adjacent rack 204. This installation prevents the hot air 216 from one computer system component 202 from exiting onto an adjacent computer system component 202.

As illustrated in FIG. 4B, using the half-height example above, two baffles 300 can be designed to be approximately 3½ feet high. In one example, since the baffles are mounted directly to the racks 204, baffle edge 312 can be flat or have interlocking pieces 314 to create a tighter fit. The interlock 314 between the two baffles 300 does not need to provide any or little structural support. The interlock between the two baffles 390 can be simple enough to prevent air flow from between the baffles 300. Alternately, the interlocks 314 can be used to provide structural support as well, separate from the rack mounting.

For the present example, the baffle 300 between racks 204b and 204c is discussed below. FIG. 3 illustrates that the cooled air 212 is coming from the top of the page and traveling downward toward the bottom of the page. Here, the front corner 302 of baffle 300 is mounted toward or on the front side 206 of the rack 204b. The rear corner 304 of baffle 300 is mounted on or near the rear 208 of rack 204c. In this way the baffle 300 forms a diagonal partition between the racks 204b, 204c. The cooled air 212 enters the front of the computer system component $202b_1$ or the side 230 of the computer system component $202c_1$. The sideways entrance of cooled air 112 into computer system component $202c_1$ is facilitated by the baffle 300. As illustrated, the baffle 300 deflects the cooled air 212 into the computer system component $202c_1$. One of ordinary skill in the art can readily visualize that without the baffle 300, some or most of the cooled air 212 could pass directly to the hot aisle 214 without cooling any of the computer system components 202b-202d.

The cooled air 212 passes through, cools the computer system component $202b_1$, and increases in temperature, now becoming the hot air 216. The hot air 216 exits the second side 232 of the computer system component $202b_1$ through an opening 203. The opening 203 is any vent found on typical computer system components 202. The opening 203 can be of any size, or filtered, or have slats (not illustrated). The hot air 216 contacts the baffle 300 and is deflected rearward toward the hot aisle 214 instead of toward the computer system component $202c_1$. The deflection by the baffle 300 prevents the computer system component $202c_1$ from taking in hot air 216 on the side 230.

As can be appreciated, the baffles 300 can be set at any angle θ to the rack 104. The angle θ should be less than 180°, in other examples, less than 45°, and in further examples, less than 25°. Note that the smaller the angle θ is (i.e., closer to 0° as illustrated in FIG. 4A), the smaller the space between racks 204a-204d. As noted above, a typical rack 206 is 42 U and the depth can vary between 24 and 48 inches. Further, the racks 204 are typically spaced between 6 and 10 inches apart. This leads to a range of the angle θ between about 7° to about 23°. For a 36 inch deep rack that is a range of θ between about 9.4° to about 15.5°.

It may be desirable to reduce the angle as floor space in a data center room is limited and expensive to maintain. Given the position and orientation of the baffle 300, it can be said that the baffle 300 has a cold side 306 that contacts the cooled air 212 and a hot side 308 that contacts the hot air 216.

Another example is illustrated in FIGS. 4A and 4B. This example includes horizontal baffles 310. The horizontal baffles 310, in the illustrated example, are set on the hot side 308 of the baffle 300, though they can be set on the cold side 306 as well. The horizontal baffles 310 are located, in one example, horizontal/parallel to the floor 222, or perpendicular or approximately perpendicular to the vertical baffle 300. Thus, they can be "flat" or tilted in any direction. Further, the horizontal baffle 310 can be shaped such that they are not flat, but curved or bowed. The shape and tilt of the both the baffle 300 and the horizontal baffle 310 can be dictated by the arrangement of the racks 204, the positioning of the openings 203, and the number of components 202.

The horizontal baffle 310 act as a cap to prevent the hot air 216 from rising and direct the hot air 216 into the hot aisle 214. The horizontal baffle 310 can be triangular in shape, and in some examples, equilateral, isosceles, right, or scalene. The shape and size of the horizontal baffle 310 can be dictated by the shape of the rack 204, the vertical baffle 300 avid the angle θ.

The horizontal baffle 310 can be used when only a subset of shelves inside a rack 204 have, mounted thereon, computer system components 202 that discharge hot air 216 (through the opening 203) to the second side 232. Without the horizontal baffle 310, the hot air 216 can rise from, for example, computer system component $202b_1$ to contact the computer system component $202b_2$ above and heat it. The horizontal baffle 310 reduces recirculation of the cooled and hot air 212, 216. While FIGS. 4A and 4B illustrate the horizontal baffle 310 above computer system components $202b_1$ and $202c_1$, they can be located between any and all computer system components 202 as the component layout within a rack 204 or the data center room 100 dictates.

As noted with the vertical baffle 300, the horizontal baffle 310 can be impervious or nearly impervious to air. Both baffles 300, 310 can be constructed of metal, plastic, wood, glass, or any other material that can limit the movement of air through it. Also, as noted above, the baffles 300, 310 can be partially impervious and partially pervious. The baffles 300, 301 can be designed straight or curved (the optional curvature of baffles 300 is shown schematically in FIG. 3). Additionally, the baffles 300, 310 can be made of flexible materials, for example rubber or Mylar. The flexible baffles 300, 310 can take alternate shapes and can be designed to be flexible enough to be displaced so technicians can gain access to the sides 230, 232 of the computer system components 202, without detaching the baffles 300, 310 from where they are secured. Further, the flexible baffles 300, 310 can be resilient enough to return their original shape after the technician completes her task.

Furthermore, the baffles 300, 310, in an example, can be layered and formed of multiple materials. In one example, the baffle 300 can have a layer of insulation between the material (s) that make up the cold and hot sides 306, 308. The horizontal baffle 310 can have a similar insulation layer construction.

The vertical and horizontal baffles 300, 310 can be of modular or unitary construction. The modular design of the baffles 300, 310 can be used for any size shelf in the rack 204 and allows for computer system component 202 reconfiguration and growth. The modular design can also allow the baffles 300, 310 to be attached and removed as the layout of the data center room dictates. Alternately, the racks 204 can have the baffles 300, 310 permanently attached to one or both racks 204 at attachment points 309 in FIG. 3, for example.

Figure 5:
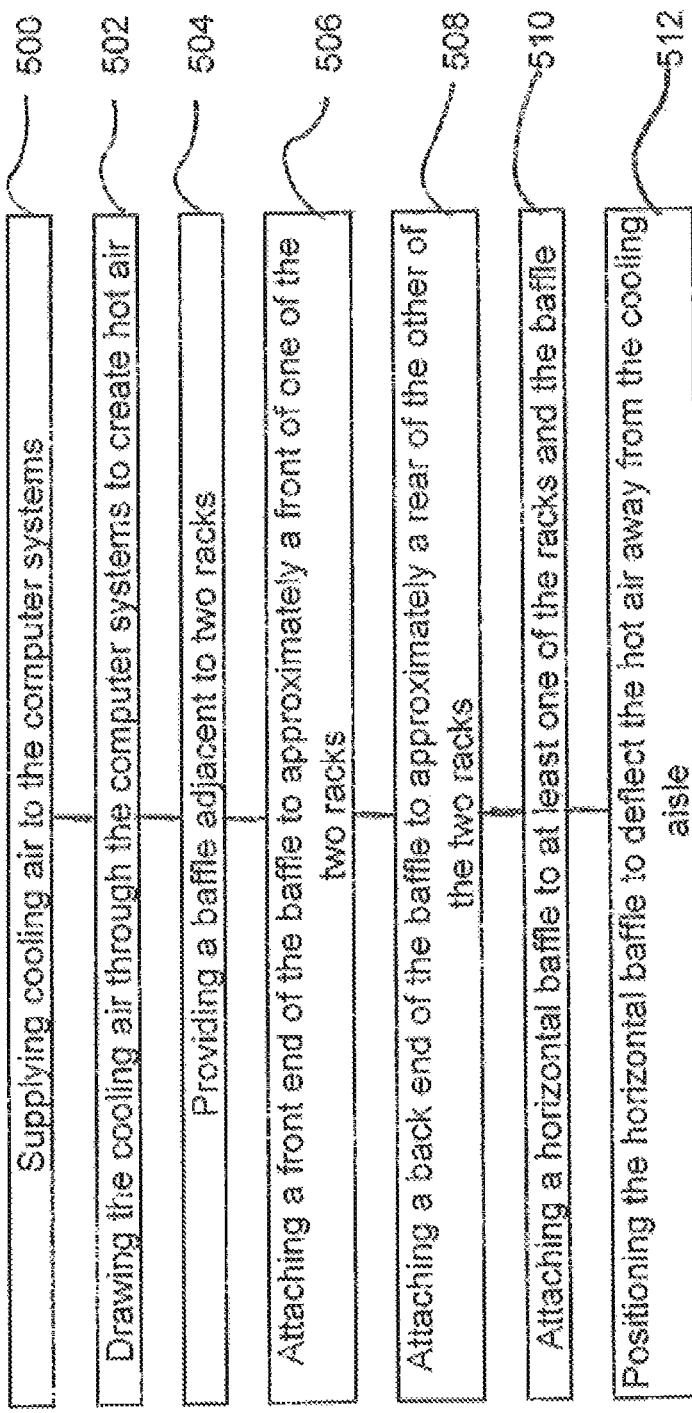
FIG. 5 is a flow chart illustrating an example of a method of cooling a data center room.

As illustrated in FIG. 5, an example of method for controlling air circulation within a data center room 200 having an aisle 210 between racks 204 with computer system components 202 mounted thereon. The method includes supplying cooling air 212 to the computer system components 202 in the racks 204 via vents 226 in the floor 222 of the room 200 in the aisle 210 (step 500), and drawing the cooling air 212 through the computer system components 202 to create hot air 216 as the computer system components 202 are cooled (step 502). The cooling air 212 can be drawn in at least by the fan 228 inside the computer system component 202. A baffle 300 can be further provided adjacent to two racks 204a and 204b that prevents the cooling air 212 from mixing with the hot air 216 (step 504).

Additionally, the method includes attaching the front end 302 of the baffle 300 to the front 206 or proximate the front 206 of one of the two racks 204a, 204b (step 506) and attaching a back end 304 of the baffle 300 to the rear 208 or proximate the rear 208 of the other of the two racks 204a, 204b (step 508). Attaching the baffle ends 302, 304 proximate to front and/or rear 206, 208 of the rack 204 can be, in one embodiment, as illustrated in FIGS. 3, 4A and 4B. FIG. 3 illustrates that the front baffle end 302 is attached along the side and set back from the front 206 of the rack while the back end 304 of the baffle is attached at the rear 208 of the rack 204. Other examples can attach the baffle 300 at points along the side of the rack 204 or both end 302, 304 at the front and rear 206, 208 of the rack 204.

Another example of additional methods is attaching the horizontal baffle 310 to at least one of the racks 204 and the baffle 300 (step 510). Thus, the horizontal baffle 310 can be attached to the rack 204, the baffle 300, or both, for support. The horizontal baffle 310 can be further positioned to deflect the hot air 216 away from the cooling aisle 210 (step 512).

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes and other specifications that are set forth in this specification, including in the claims that follow, are approximate not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A data room air circulation system, comprising:
two racks located side by side, wherein each of the racks has a front, a rear, a first side configured to receive cold air and a second side configured to emit hot air,
the second side of one of the racks facing a first side of the other of the racks;
at least one computer system component mounted in each of the two racks;
a cold aisle located at the front of the racks, the cold aisle containing cold air;
a hot aisle located at the rear of the racks, the hot aisle containing hot air,
wherein the hot air is cold air that has passed through the at least one of the computer system components; and a baffle, having a front baffle end, a rear baffle end, a hot air side, a cool air side and a height, located between the second side of the one rack and the first side of the other rack such that the front baffle end is attached at or proximate to the front of the one rack, the rear baffle end is attached at or proximate to the rear of the other rack, the hot air side of the baffle faces the second side of the one rack and the hot aisle, and the cool air side of the baffle faces the first side of the other rack and the cold aisle, wherein the baffle separates the cold aisle from the hot aisle for at least the height of the baffle.

2. The system of claim 1, wherein the at least one computer system component mounted in the one rack comprises an opening for releasing the hot air, and the baffle is located to deflect the hot air from the opening toward the hot aisle.

3. The system of claim 2, wherein the at least one computer system component mounted in the other rack comprises another opening, for receiving the cold air; and the baffle is located to deflect the cold air from the cold aisle toward the other opening.

4. The system of claim 1, wherein the baffle is curved.

5. The system of claim 1, wherein the baffle is constructed from a flexible material.

6. The system of claim 1, wherein the height of the baffle is equal to a height of the racks.

7. The system of claim 1, wherein the height of the baffle is equal to a distance between shelves of one of the racks.

8. The system of claim 1, wherein the height of the baffle is equal to a height of the at least one computer system component mounted in one of the racks.

9. The system of claim 1, wherein the height of the baffle is equal to or less than half of a height of the racks.

10. The system of claim 1, further comprising:
a second baffle having a front baffle end, a rear baffle end, a hot air side, a cool air side and a height, located between the second side of the one rack and the first side of the other rack, wherein:
the front baffle end of the second baffle is attached at or proximate to the front of the one rack,
the rear baffle end of the second baffle is attached at or proximate to the rear of the other rack,
the hot air side of the second baffle faces the second side of the one rack and the hot aisle, and
the cool air side of the second baffle faces the first side of the other rack and the cold aisle.

11. The system of claim 9, wherein adjacent edges of the baffles are configured to form an interlock.

12. An arrangement of racks, comprising:
first and second racks each configured to support one or more computer system components, wherein each of the first and second racks has a front, a rear, a first side configured to receive cold air and a second side configured to emit hot air,
the first and second racks being located side by side with: the second side of the first rack facing the first side of the second rack, the fronts of the first and second racks along a cold aisle, and the backs of the first and second racks along a hot aisle; and
a baffle, having a front baffle end, a rear baffle end, a hot air side, a cool air side and a height, located between the second side of the one rack and the first side of the second rack, wherein:
the front baffle end is attached at or proximate to the front of the first rack,
the rear baffle end is attached at or proximate to the rear of the second rack,
the hot air side of the baffle faces the second side of the first rack and the hot aisle, and
the cool air side of the baffle faces the first side of the second rack and the cold aisle.

13. The arrangement of claim 12, wherein the baffle is curved.

14. The arrangement of claim 12, wherein the baffle is constructed from a flexible material.

15. The arrangement of claim 12, wherein the height of the baffle is equal to a height of the racks.

16. The arrangement of claim 12, wherein the height of the baffle is equal to a distance between shelves of one of the racks.

17. The arrangement of claim 12, wherein the height of the baffle is equal to a height of the at least one computer system component to be mounted in one of the racks.

18. The arrangement of claim 12, wherein the height of the baffle is equal to or less than half of a height of the racks.

19. The arrangement of claim 12, further comprising:
a second baffle having a front baffle end, a rear baffle end, a hot air side, a cool air side and a height, located between the second side of the first rack and the first side of the second rack, wherein:
the front baffle end of the second baffle is attached at or proximate to the front of the first rack,
the rear baffle end of the second baffle is attached at or proximate to the rear of the second rack,
the hot air side of the second baffle faces the second side of the first rack and the hot aisle, and
the cool air side of the second baffle faces the first side of the second rack and the cold aisle.

20. The arrangement of claim 13, wherein adjacent edges of the baffles are configured to form an interlock.

* * * * *